(12) United States Patent
Singh

(10) Patent No.: US 7,148,535 B2
(45) Date of Patent: Dec. 12, 2006

(54) ZERO CAPACITANCE BONDPAD UTILIZING ACTIVE NEGATIVE CAPACITANCE

(75) Inventor: Prashant K. Singh, Eden Praire, MN (US)

(73) Assignee: LSI Logic Corporation, Milpitas, CA (US)

( * ) Notice: Subject to any disclaimer, the term of this patent is extended or adjusted under 35 U.S.C. 154(b) by 339 days.

(21) Appl. No.: 10/647,863

(22) Filed: Aug. 25, 2003

(65) Prior Publication Data

US 2005/0046029 A1  Mar. 3, 2005

(51) Int. Cl.
*H01L 23/48* (2006.01)
*H01L 23/485* (2006.01)
*H01L 23/52* (2006.01)
*H01L 23/522* (2006.01)

(52) U.S. Cl. .............................. 257/300; 257/E23.153; 257/E23.167; 257/E27.024; 257/E21.022; 257/471; 257/759; 257/773; 257/383; 257/435; 257/774; 257/775; 257/755; 257/528; 257/532; 257/734; 257/786; 257/784; 257/E23.02; 257/E23.144

(58) Field of Classification Search ................ 257/300, 257/471, 485, 760, 773, 774, 383, 435, 775, 257/755–759, 483, 700, 701, 758, 784, 786, 257/734, 528, 532, E21.022, E23.153, E23.167
See application file for complete search history.

(56) References Cited

U.S. PATENT DOCUMENTS

| | | | | |
|---|---|---|---|---|
| 5,760,456 A | * | 6/1998 | Grzegorek et al. | 257/531 |
| 6,201,287 B1 | * | 3/2001 | Forbes | 257/528 |
| 6,385,019 B1 | * | 5/2002 | Gagne et al. | 361/15 |
| 6,484,559 B1 | * | 11/2002 | Dodabalapur et al. | 73/23.34 |
| 6,897,507 B1 | * | 5/2005 | Lin | 257/300 |
| 2002/0022793 A1 | * | 2/2002 | Bertrand et al. | 604/9 |
| 2002/0117693 A1 | * | 8/2002 | Dodabalapur et al. | 257/253 |
| 2005/0047064 A1 | * | 3/2005 | Singh | 361/640 |
| 2005/0104157 A1 | * | 5/2005 | Coolbaugh et al. | 257/531 |
| 2005/0230783 A1 | * | 10/2005 | Lin | 257/531 |

* cited by examiner

*Primary Examiner*—Alexander Oscar Williams
(74) *Attorney, Agent, or Firm*—Suiter·Swantz PC LLO

(57) ABSTRACT

The present invention is an apparatus and system for reducing bondpad capacitance of an integrated circuit. Circuitry of the present invention may produce a negative capacitance approximately equal in magnitude to the capacitance associated with the bondpad and thereby effectively eliminate the bondpad capacitance. Values of the components of the circuitry may be selectively and independently chosen to synthesize a variable range of negative capacitance and thus produce a negative capacitance approximately equal in magnitude to a unique capacitance associated with the bondpad of a variety of integrated circuits.

12 Claims, 2 Drawing Sheets

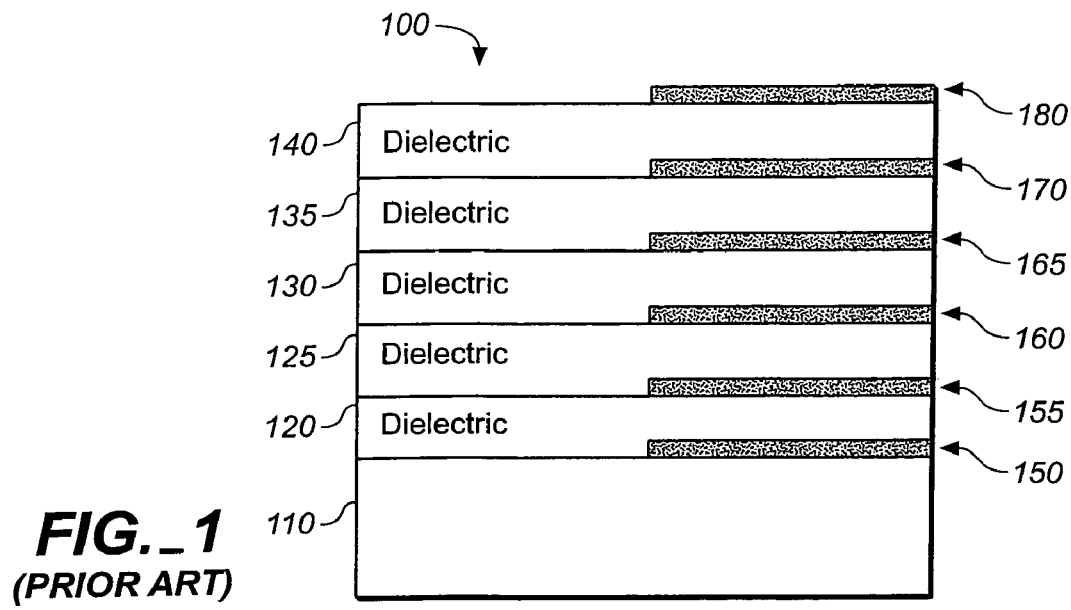
FIG._1
*(PRIOR ART)*
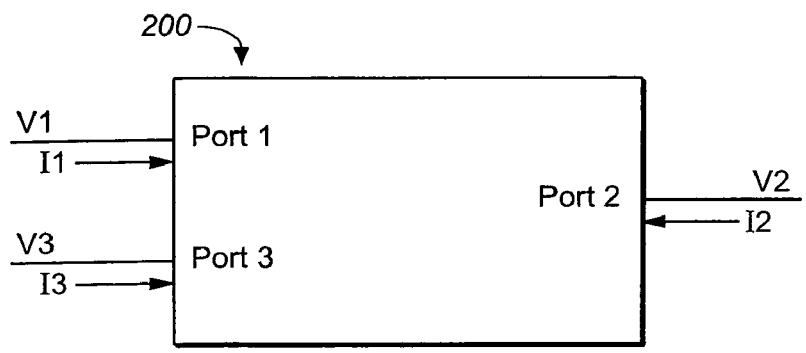
FIG._2
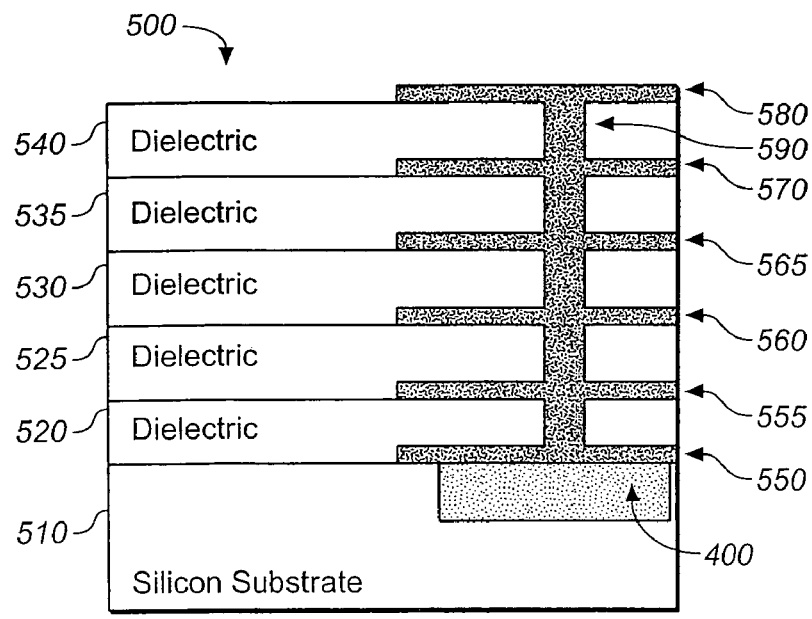
FIG._5

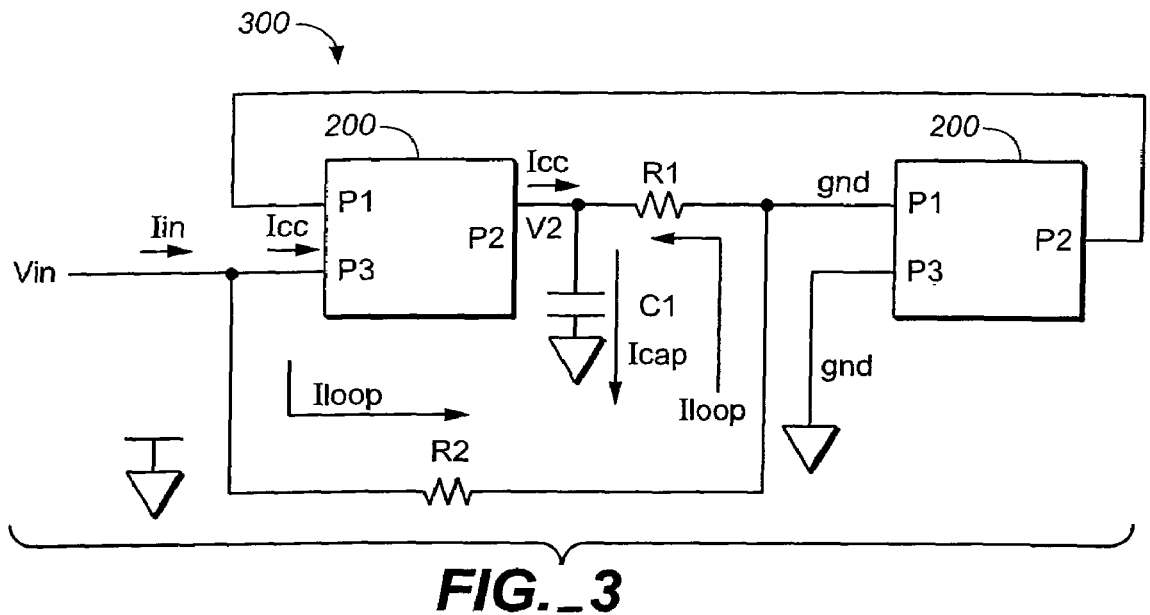
FIG._3
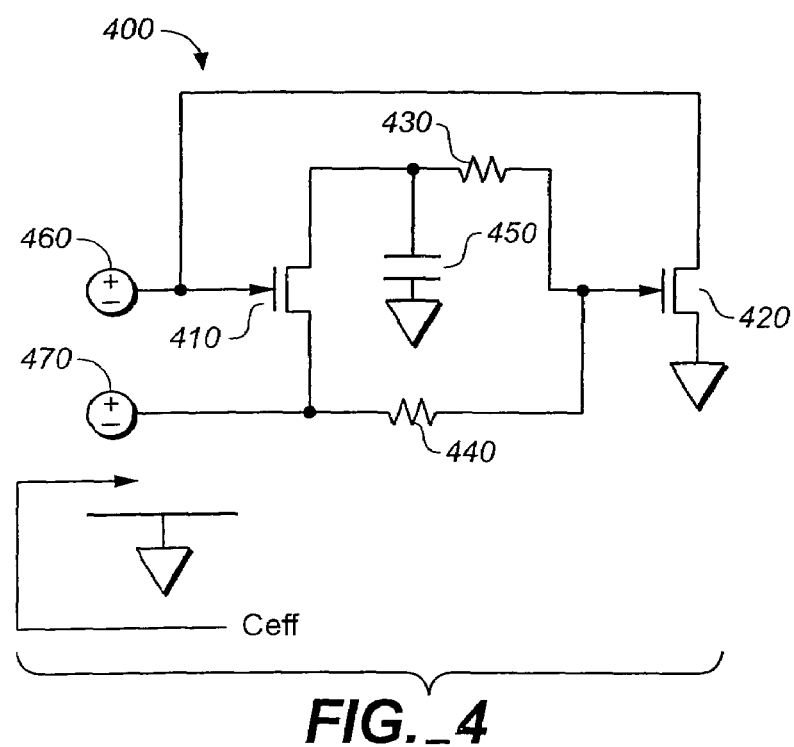
FIG._4

ZERO CAPACITANCE BONDPAD UTILIZING ACTIVE NEGATIVE CAPACITANCE

FIELD OF THE INVENTION

The present invention generally relates to the field of integrated circuits, and more particularly to an apparatus for reducing bondpad capacitance of an integrated circuit.

BACKGROUND OF THE INVENTION

Integrated circuits are employed in most of the digital appliances utilized on a daily basis by consumers. Integrated circuits may refer to an electronic circuit built onto a single piece of substrate, a chip, and enclosed within a package. Integrated circuits generally perform a desired function or plurality of functions. In the fabrication of integrated circuits, bondpads are employed to form the connection from the integrated circuit to the package. A package may refer to the housing of the chip and electrically interconnects the chip with outside circuitry.

Referring to FIG. 1, an embodiment of an integrated circuit 100 known to the art is shown. An integrated circuit 100 may include a silicon substrate layer 110 with multiple dielectric layers 120–140 and multiple metal layers 150–170. The bondpad 180 may refer to the top layer of metal and allows a connection from the integrated circuit to the package, a package pin for example.

Capacitance occurs between the bondpad 180 and the other metal layers 150–170. The amount of capacitance is typically proportional to the area of the bondpad 180 and increases as the distance between the bondpad 180 and the metal layers 150–170 decreases. A drawback caused by the capacitance associated with the bondpad 180 is a reduction in circuit performance. As operating speeds have increased, circuit performance has been further reduced by the capacitance associated with the bondpad.

Conventional solutions to reducing the capacitance associated with the bondpad have involved the modification of the layer structure of the integrated circuit. However, modification of the layer structure is expensive and typically causes reduced reliability of the circuit. Further, this type of capacitance reduction only provides a minimal reduction in capacitance. Consequently, an improved apparatus and system for reducing the bondpad capacitance of an integrated circuit is necessary.

SUMMARY OF THE INVENTION

Accordingly, the present invention is directed to an apparatus and system for reducing bondpad capacitance of an integrated circuit. In an embodiment of the invention, circuitry of the present invention may produce a negative capacitance approximately equal in magnitude to the capacitance associated with the bondpad and thereby effectively eliminate the bondpad capacitance. Further, circuitry of the present invention may be employed within an integrated circuit without modifying the layer structure of the integrated circuit. In an advantageous aspect of the present invention, values of the components of the circuitry may be selectively and independently chosen to synthesize a variable range of negative capacitance. Thus, the circuitry of the present invention may be employed in a variety of integrated circuits, each of which may have a unique capacitance associated with the bondpad.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 depicts an embodiment of an integrated circuit known to the art;

FIG. 2 depicts an embodiment of a current conveyor in accordance with the present invention;

FIG. 3 depicts an embodiment of a negative capacitance generator 300 with two current conveyors in accordance with the present invention;

FIG. 4 depicts an embodiment of active circuitry for generating a negative capacitance in accordance with the present invention; and FIG. 5 depicts an embodiment of an integrated circuit employing active circuitry for generating a negative capacitance in accordance with the present invention.

DETAILED DESCRIPTION OF THE INVENTION

Reference will now be made in detail to the presently preferred embodiments of the invention, examples of which are illustrated in the accompanying drawings.

Referring to FIG. 2, an embodiment of a current conveyor 200 in accordance with the present invention is shown. Current conveyor 200, a three port device, may be the building block of a negative capacitance generator (shown in FIG. 3) of the present invention, with the following properties:

$$\begin{bmatrix} i1 \\ i2 \\ v3 \end{bmatrix} = \begin{bmatrix} 0 & 0 & 0 \\ 0 & -1 & 0 \\ 1 & 0 & 0 \end{bmatrix} \begin{bmatrix} v1 \\ i3 \\ v3 \end{bmatrix} \quad \text{(Equation 1)}$$

From Equation 1, the following equations may be obtained:

$i1=0$ $i2=-i3$ $v3=v1$

From these equations, it may be determined that the current conveyor 200 has a high impedance node at Port 1, in which there may be no current flow. Current conveyor 200 may also have a voltage follower property that may transfer the voltage at Port 1 to Port 3 along with a current flow property that may transfer current from Port 3 through Port 1.

Referring to FIG. 3, an embodiment of a negative capacitance generator 300 with two current conveyors in accordance with the present invention is shown. From an analysis of FIG. 3 and employing well known electrical principles, the following relations may be obtained:

$Iin = Icc + Iloop$ \quad (Equation 2)

$$I_{cc}+I_{loop}=I_{cap} \quad \text{(Equation 3)}$$

$$V_{in}=I_{loop}*R2 \quad \text{(Equation 4)}$$

$$V2=-I_{loop}*R1 \quad \text{(Equation 5)}$$

$$I_{cap}=V2/j\omega C \quad \text{(Equation 6)}$$

By combining Equation 2 and Equation 3, Iin=Icap (Equation 7)

Equation 6 may be written as:

$$I_{cap}=V2/j\omega C=-I_{loop}*R1/j\omega C=-V_{in}*R1/R2*j\omega C \quad \text{(Equation 8)}$$

Equation 7 and Equation 8 may be combined to yield $$I_{in}/V_{in}=-(R1/R2)*j\omega C=j\omega C_{eff} \quad \text{(Equation 9)}$$

From Equation 9, the effective capacitance into Port 3 of the negative capacitance generator 300 may be determined as:

$$C_{eff}=-(R1/R2)*C \quad \text{(Equation 10)}$$

Referring to FIG. 4, an embodiment of circuitry 400 for generating a negative capacitance in accordance with the present invention is shown. It is contemplated that current conveyor 200 of the present invention may be implemented through a transistor, such as an n-channel metal oxide silicon field effect transistors (MOSFET). In the embodiment of employing a MOSFET, Ports 1–3 of FIG. 2 may refer to the terminals of the MOSFET whereby Port 1 may refer to the gate, Port 2 may refer to the drain, and Port 3 may refer to the source. Consequently, negative capacitance generator 300 of FIG. 3 may be implemented as shown in circuitry 400 as shown in FIG. 4.

Active circuitry 400 may include a pair of transistors 410–420, resistors 430–440, capacitor 450. Transistor 410 and transistor 420 each operate as a current conveyor 200 of FIG. 2. Since Port 1 of FIG. 2 is the gate of a MOSFET, the current that flows into the drain is equal to the current that flows out of the source. In some applications of a MOSFET embodiment, the gate to source voltage drop may prevent the gate voltage from being identically equal source voltage. Thus, in an alternative embodiment, multiple MOSFETS may be utilized in parallel, rather than employing a single MOSFET 410–420 to reduce the gate to source voltage drop closer to zero. For example, a pair of MOSFET transistors connected in parallel may take the place of transistor 410 while another pair of transistors connected in parallel may take the place of transistor 420. This is advantageous as this may allow the gate voltage to be approximately equal to the source voltage.

Two bias voltages 460–470 may be utilized to control operation of the circuitry 400. Bias voltages 460–470 may be coupled to voltage controls of an integrated circuit in which the circuitry 400 has been included to reduce the bondpad capacitance associated with the integrated circuit. In an advantageous aspect of the present invention, a negative capacitance may be produced as previously described with respect to the negative capacitance generator 300 of FIG. 3. The value of the negative capacitance produced:

$$C_{eff}=(\text{Resistor 430/Resistor 440})*\text{Capacitor 450}$$

While active circuitry 400 shown in FIG. 4 employs n channel metal oxide silicon field effect transistors (MOSFETS), it is contemplated that the circuitry could employ bipolar transistors or gallium arsenide pseudomorphic high-electron mobility transistors (PHEMTS) without departing from the scope and spirit of the present invention. Additionally, other types of circuits may be employed to generate a negative capacitance as contemplated by one of ordinary skill in the art without departing from the scope and intent of the present invention.

An advantageous aspect of active circuitry 400 of the present invention lies in the adjustability of the negative capacitance produced. By simply adjusting the values for resistors 430–440 and capacitor 450, the negative capacitance produced by the active circuitry may be adjusted. This is advantageous from a manufacturing perspective as the same circuitry may be manufactured with different component values to compensate for different bondpad capacitances associated with different types of integrated circuits.

Referring now to FIG. 5, an embodiment of an integrated circuit 500 employing active circuitry for generating a negative capacitance in accordance with the present invention is shown. Similar to the integrated circuit known to the art shown in FIG. 1, integrated circuit 500 may include a plurality of dielectric layers 520–540 and a plurality of metal layers 550–570. Metal layers may refer to any type of metal utilized in the formation and fabrication of integrated circuits, similarly dielectric materials may include various forms of nonconductors known to the art.

Negative capacitance circuitry 400 may be fabricated in the silicon substrate 510 of the integrated circuit 500. The negative capacitance circuitry 400 may be coupled to the bondpad 580 via a stack 590. The stack 590, also known as a via by those with ordinary skill in the art, may run through the metal and dielectric layers from the silicon substrate 510 to the bondpad 580. It is contemplated that stack 590 may be formed of metal or other conducting material and connected to the portion of the equivalent capacitance portion (Ceff) of the negative capacitance circuitry 400 of FIG. 4.

An amount of negative capacitance produced may be a value, i.e. a magnitude, to compensate for the positive capacitance associated with the bondpad 580. Advantageously, this amount may reduce the negative effects associated with bondpad capacitance and may improve performance of the integrated circuit 500. Additionally, the value of the negative capacitance produced by the circuitry 400 of the present invention may be approximately equal in magnitude to the capacitance associated with the bondpad 580 whereby magnitude refers to a quantity. For example, the bondpad capacitance may be +10 microFarads as an arbitrary value. In this same example, a negative capacitance of –10 microFarads may be generated by circuitry 400, thus, the magnitude of the negative capacitance generated would be approximately equal to the magnitude of the bondpad capacitance.

In an advantageous aspect of the present invention, the negative capacitance circuitry 400 may be fabricated within the silicon substrate 510 during the manufacture of the integrated circuit. This provides a cost-effective method of compensating for the bondpad capacitance. Additionally, the negative capacitance circuitry 400 of the present invention may be incorporated within the integrated circuit 500 without modifying the layer structure of the integrated circuit.

It is contemplated that the negative capacitance circuitry 400 may be employed with a number of different embodiments of integrated circuits in order to compensate for bondpad capacitance without departing from the scope and intent of the present invention. For example, silicon substrate may be formed of other materials known to the art. One or more layers of dielectric material and metal layers may be employed in alternative embodiments of the invention.

It is believed that the system and method and system of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. An integrated circuit, comprising:
   a substrate;
   at least one area of dielectric material disposed on said substrate;
   at least one area of metal material disposed on said substrate;
   a bondpad associated with said at least one area of dielectric material and said at least one area of metal material; and
   a circuitry for generating a negative capacitance, said circuitry comprising:
      at least two transistors;
      at least two resistors; each resistor of said at least two resistors being coupled to each of said at least two transistors; and
      a capacitor coupled to a first transistor of said at least two transistors and a first resistor of said at least two resistors; wherein said circuitry generates said negative capacitance of a value to compensate for a capacitance associated with said bondpad, said circuitry being coupled to said bondpad.

2. The integrated circuit as claimed in claim 1, wherein a value of said negative capacitance is approximately equal in magnitude to said capacitance associated with said bondpad.

3. The integrated circuit as claimed in claim 1, wherein said negative capacitance generated by said circuitry is dependent upon component values of said at least two resistors and said capacitor.

4. The integrated circuit as claimed in claim 1, wherein said circuitry is fabricated within the substrate.

5. An apparatus, comprising:
   a housing;
   a substrate disposed within said housing;
   at least one area of dielectric material disposed on said substrate;
   at least one area of metal material disposed on said substrate;
   a bondpad associated with said at least one area of dielectric material and said at least one area of metal material, said bondpad being coupled to said housing; and
   a circuitry for generating a negative capacitance, said circuitry comprising:
      at least two transistors;
      at least two resistors; each resistor of said at least two resistors being coupled to each of said at least two transistors; and
      a capacitor coupled to a first transistor of said at least two transistors and a first resistor of said at least two resistors; wherein said circuitry generates said negative capacitance of a value to compensate for a capacitance associated with said bondpad, said circuitry being coupled to said bondpad.

6. The apparatus as claimed in claim 5, wherein said value of said negative capacitance is approximately equal in magnitude to said capacitance associated with said bondpad.

7. The apparatus as claimed in claim 5, wherein said negative capacitance generated by said circuitry is dependent upon a component values of said at least two resistors and said capacitor.

8. The apparatus as claimed in claim 7, wherein said negative capacitance generated by said circuitry is dependent upon a ratio of a first resistor to a second resistor multiplied by a value of said capacitor.

9. The apparatus as claimed in claim 5, wherein said circuitry is fabricated within the substrate.

10. An apparatus, comprising:
    a substrate;
    at least one area of dielectric material disposed on said substrate;
    at least one area of metal material disposed on said substrate;
    a bondpad associated with said at least one area of dielectric material and said at least one area of metal material; and
    a circuitry for generating a negative capacitance, said circuitry comprising:
       at least two transistors;
       at least two resistors; each resistor of said at least two resistors being coupled to each of said at least two transistors; and
       a capacitor coupled to a first transistor of said at least two transistors and a first resistor of said at least two resistors; wherein said circuitry generates said negative capacitance of a value to compensate for a capacitance associated with said bondpad, said circuitry being coupled to said bondpad.

11. The apparatus as claimed in claim 10, wherein said negative capacitance generated by said circuitry is dependent upon component values of said at least two resistors and said capacitor.

12. The apparatus as claimed in claim 11, wherein said negative capacitance generated by said circuitry is dependent upon a ratio of a first resistor to a second resistor multiplied by a value of said capacitor.

* * * * *